United States Patent
Enomoto et al.

(10) Patent No.: US 6,842,976 B2
(45) Date of Patent: Jan. 18, 2005

(54) METHOD OF CONNECTING FLAT CABLE AND TERMINAL

(75) Inventors: Noritsugu Enomoto, Tokyo (JP); Yoshiyuki Suzuki, Tokyo (JP); Mitsuhiro Yamamura, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/219,701

(22) Filed: Aug. 14, 2002

(65) Prior Publication Data

US 2003/0106211 A1 Jun. 12, 2003

Related U.S. Application Data

(63) Continuation of application No. PCT/JP01/10901, filed on Dec. 12, 2001.

(30) Foreign Application Priority Data

Dec. 15, 2000 (JP) .......................................... 2000-382096
Apr. 9, 2001 (JP) .......................................... 2001-110086

(51) Int. Cl.[7] .......................... H05K 3/00; H01K 11/20; H01K 4/24; H01K 4/26
(52) U.S. Cl. ............................... 29/845; 29/844; 29/861; 29/876; 29/882; 29/513; 29/432.1; 439/422
(58) Field of Search .......................... 29/844, 845, 861, 29/876, 882, 513, 432.1; 439/421, 422

(56) References Cited

U.S. PATENT DOCUMENTS

| | | | | | |
|---|---|---|---|---|---|
| 4,012,101 | A | * | 3/1977 | Damoisiaux et al. | 439/422 |
| 4,082,402 | A | * | 4/1978 | Kinkaid et al. | 439/422 |
| 4,749,368 | A | * | 6/1988 | Mouissie | 439/421 |
| 4,784,623 | A | * | 11/1988 | Beck, Jr. | 439/872 |
| 4,921,442 | A | * | 5/1990 | Puerner | 439/499 |
| 5,137,468 | A | * | 8/1992 | Murakami | 439/422 |
| 5,375,317 | A | * | 12/1994 | Murakami et al. | 29/753 |

FOREIGN PATENT DOCUMENTS

| | | |
|---|---|---|
| JP | 62-165883 | 7/1987 |
| JP | 4-8372 | 1/1992 |
| WO | WO 02/49175 | 6/2002 |

* cited by examiner

*Primary Examiner*—A. Dexter Tugbang
*Assistant Examiner*—Tai Nguyen
(74) *Attorney, Agent, or Firm*—Knobbe, Martens, Olson & Bear, LLP

(57) ABSTRACT

A method of connecting a flat cable and a terminal, comprising a sticking step in which cramp pieces (13b–13d) are stuck through a flat cable (10) to be received in corresponding cavities (15b, 15c) that are provided to allow the cramp pieces to maintain their shapes, and a cramping step in which the cramp pieces that have been stuck through the flat cable are bent and thereby cramped to the flat cable.

6 Claims, 9 Drawing Sheets

METHOD OF CONNECTING FLAT CABLE AND TERMINAL

This application is a continuation of PTC/JP01/10901 filed Dec. 12, 2001.

TECHNICAL FIELD

The present invention relates to a method of connecting a flat cable and a terminal in which a flexible flat cable comprising a relatively narrow flat conductor insulated with a film of insulation, which is for use in wiring in electric apparatus and automobiles, and a terminal having a plurality of cramp pieces are connected by sticking the cramp pieces of the terminal through the flat cable so that the flat conductor and the terminal may be electrically connected.

BACKGROUND ART

A flat cable 1 is a flexible cable wherein a plurality of flat conductors 1a are arranged in parallel and insulated with an insulation 1b as shown in FIGS. 16 and 18. A terminal 3 comprises a substrate 3a of a width W11 and a plurality of cramp pieces 3b~3d which project alternately on the opposite sides of the substrate 3a as shown in FIG. 17.

Conventionally, the flat cable 1 and the terminal 3 are electrically connected as follows: As shown in FIG. 16, a cramp 5 having a bending concave portion 5a is placed under an intended flat conductor 1a. Then, a terminal 3 is placed just over the intended flat conductor 1a, being guided by positioning walls 6 as shown in FIG. 16. The terminal 3 is then stuck into the intended flat conductor 1a by pressing the terminal 3 with a pressing member 7 from above. The cramp pieces 3b~3d that have been stuck through the flat cable 1 are bent inward, i.e., toward each other by the bending concave portion 5a of the cramp 5 as shown in FIG. 18. As a result, the terminal 3 is electrically connected with the intended flat conductor 1a of the flat cable 1.

This way of connecting the flat cable 1 and the terminal 3 is usable when the flat cable 1 has a flat conductor 1a of, for example, 0.15 mm in thickness and more than 3 mm or so in width.

However, in recent years, a flat cable having a flat conductor of, for example, 0.15 mm in thickness and 1.5~2.0 mm or so in width has come into use in complicated wiring circuits. When a flat cable has a small conductor-width as above, a small terminal whose substrate-width is 1.2 mm or so corresponding to the conductor-width is used.

In the small conductor as above, cramp pieces are smaller in size and rigidity than those of an ordinary terminal, and therefore easily buckle when they are stuck into a flat cable.

The cramp pieces that have buckled cannot form stable curves as shown in FIG. 18. This causes a problem that stable electrical connection with little variation in contact resistance cannot be formed between the terminal and a flat conductor.

In addition, since the small terminal is small in rigidity, it cannot be used for connecting small-width flat conductors 1a of flat cables that are crossed.

An object of the present invention is to provide a method of connecting a flat cable and a terminal wherein a flat conductor and cramp pieces can be connected stably with little variation in contact resistance.

Another object of the present invention is to provide a method of connecting a flat cable and a terminal wherein a larger area of contact between cramp pieces and a flat conductor can be ensured, so that a stable electrical connection can be formed.

Another object of the present invention is to provide a method of connecting a flat cable and a terminal wherein cramp pieces can be surely stuck through flat conductors when a plurality of terminals should be connected to a plurality of flat conductors, respectively.

Another object of the present invention is to provide a method of connecting a flat cable and a terminal wherein cramp pieces can be stuck through flat conductors of flat cables placed one on another, without buckling.

Another object of the present invention is to provide a method of connecting a flat cable and a terminal wherein cramp pieces can be stuck through flat conductors of flat cables placed one on another, without buckling, and a larger area of contact between the cramp pieces and the flat conductors can be ensured, so that a stable electrical connection can be formed.

Another object of the present invention is to provide a method of connecting a flat cable and a terminal wherein terminals can be connected to flat conductors of flat cables placed one on another, without cramp pieces buckling, and the cramp pieces can be surely stuck through corresponding flat conductors.

DISCLOSURE OF THE INVENTION

The invention is to improve a method of connecting a flat cable and a terminal in which a flexible flat cable comprising a plurality of flat conductors insulated with an insulation and a terminal having a plurality of cramp pieces are connected by sticking the cramp pieces of the terminal through the flat cable in an area corresponding to an intended flat conductor of the plurality of flat conductors to thereby connect the cramp pieces with the intended flat conductor, and bending the cramp pieces that have been stuck through the flat cable to thereby fix the cramp pieces to the flat cable.

The method of connecting a flat cable and a terminal according to the present invention comprises a sticking step in which the cramp pieces are stuck through the flat cable to be received in corresponding receiving cavities that are provided to allow the cramp pieces to maintain their shapes; and a cramping step in which the cramp pieces that have been stuck through the flat cable are bent and thereby cramped to the flat cable.

When the cramp pieces are connected with the flat conductor of the flat cable by these two steps, i.e., the sticking step and the cramping step, the cramp pieces can be surely stuck through the flat conductor, even if the terminal is small in size and the flat conductor is small in width. In addition, long edge portions of the flat conductor that has been drawn out and cut by sticking the cramp pieces through the flat conductor can be brought into sufficient contact with the cramp piece, and surely bent into a stable shape. Thus, the cramp pieces can be easily connected with the flat conductor with little variation in contact resistance.

In the method of connecting a flat cable and a terminal according to the present invention, in the sticking step, each of the cramp pieces is stuck through the flat cable in a position that allows the cramp piece to be received in the corresponding receiving cavity with a larger space on an inner side and with a smaller space on an outer side, where the inner side means a side closer to an opposite receiving cavity.

When each of the cramp pieces are stuck through the flat cable in the above-described manner, shearing stress produced in the flat conductor is larger on the smaller-space side than on the larger-space side. Therefore, on the smaller-space side, the flat conductor is drawn out less before it shears off. On the larger-space side, the flat conductor is drawn out longer before the cramp piece is stuck through the flat conductor. Then, when the cramp piece is bent into a circular arc shape and thereby cramped to the flat cable, the longer drawn-out edge portion of the flat conductor is rolled in the cramp piece. This ensures a large area of electrical contact between the cramp piece and the flat conductor, and therefore, forms a stable electrical connection.

In the method of connecting a flat cable and a terminal according to the present invention, cramp pieces of a plurality of terminals are stuck through their corresponding flat conductors of a flat cable at the same time.

In this case, the cramp pieces of all the terminals are stuck through their corresponding flat conductors before the flat conductors are drawn out due to the cramp pieces being stuck through them. This ensures that the cramp pieces are stuck through their corresponding flat conductors in position. In addition, in this method, since a plurality of terminals are stuck into a plurality of corresponding flat conductors by a single action, the tact time, i.e., the time required to connect the terminals to the flat cable is reduced.

Also, the invention is to improve a method of connecting a flat cable and a terminal in which cramp pieces are stuck through a plurality of flat cables placed one on another.

In the method of connecting a flat cable and a terminal according to the present invention, it is arranged that a wall between the receiving cavities has an upper surface that is at a lower height than the upper surfaces of outer walls of the receiving cavities.

In this case, when the cramp pieces, which should be stuck through the insulations and flat conductors of the flat cables placed one on another, is stuck into upper flat cables, even if lower flat cables bend downwards, the bending portions of the lower flat cables are held in a space over the wall that is smaller in height. Thus, the bending portions of the lower flat cables do not come into the receiving cavities, and therefore, the cramp pieces are stuck through the lower flat cables without difficulties. As a result, the upper and lower flat conductors are connected together by the cramp pieces of the terminal, stably.

In the method of connecting a flat cable and a terminal according to the present invention, if flat conductors of flat cables that should be placed one on another are different in width, it is arranged that cramp pieces are stuck through the flat conductors from a wider flat conductor to a narrower flat conductor.

This means that the terminal is stuck into a narrower flat conductor over a wider flat conductor. Therefore, the terminal never fails to be stuck into a wider flat conductor placed under a narrower flat conductor. Thus, the flat conductors placed one on another are surely connected together by the cramp pieces stuck through them.

In the method of connecting a flat cable and a terminal according to the present invention, in the sticking step, each of the cramp pieces is stuck through the flat cables placed one on another, in a position that allows the cramp piece to be received in the corresponding receiving cavity with a larger space on an inner side and with a smaller space on an outer side, where the inner side means a side closer to an opposite receiving cavity.

In this case, shearing stress produced in the flat conductors placed one on another is larger on the smaller-space side than on the larger-space side. Therefore, on the smaller-space side, the flat conductors are drawn out less before they shear off. On the larger-space side, the flat conductors are drawn out longer before the cramp piece is stuck through the flat conductors. Then, when the cramp piece is bent into a circular arc shape and thereby cramped to the flat cables, the longer drawn-out edge portions of the flat conductors are rolled in the cramp piece. This ensures a large area of electrical contact between the cramp piece and the flat conductors, and therefore, forms a stable electrical connection.

In the method of connecting a flat cable and a terminal according to the present invention, cramp pieces of a plurality of terminals are stuck through their corresponding flat conductors of flat cables placed one on another at the same time.

In this case, the cramp pieces of all the terminals are stuck through their corresponding flat conductors placed one on another, before the flat conductors are drawn out due to the cramp pieces being stuck through them. This ensures that the cramp pieces are stuck through their corresponding flat conductors in position. In addition, in this method, since a plurality of terminals are stuck though a plurality of corresponding flat conductors placed one on another by a single action, the tact time, i.e., the time required to connect the terminals to the flat cables is reduced.

BRIEF DESCRIPTION OF THE DRAWINGS

FIGS. 14A to 14E show the cramp pieces in the states that they are stuck into the flat cables by different lengths, respectively, where the lengths are measured from the upper surface of the upper flat cable considered as a reference plane;

BEST MODE OF CARRYING OUT THE INVENTION

FIGS. 1 to 4 show a first embodiment of method of connecting a flat cable and a terminal according to the present invention.

Figure 1:
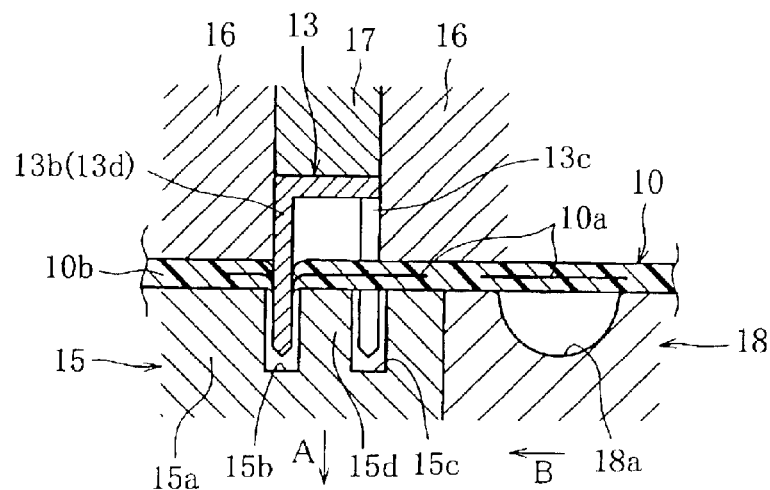
FIG. 1 is a cross-sectional view showing a first embodiment of method of connecting a flat cable and a terminal according to the present invention.
Figure 2:
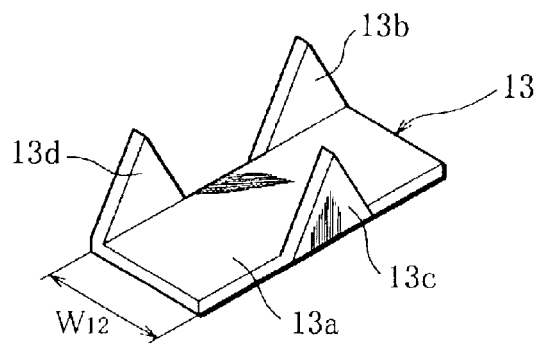
FIG. 2 is a perspective view of a terminal used in the method according to the present invention.

In the method of connecting a flat cable and a terminal according to the present invention, as shown in FIG. 1, a flexible flat cable 10 which comprises a plurality of flat conductors 10a of 1.5 mm or so in width coated with a film of insulation 10b is placed on a punch die 15. The punch die 15 has receiving cavities 15b, 15c for receiving cramp pieces 13b~13d of a terminal 13 (described later), inside an outer wall 15a. Between the receiving cavities 15b, 15c stands a partition wall 15d. The upper end of the partition wall 15d and the upper end of the outer wall 15a are at the same height. As shown in FIG. 2, the terminal 13 comprises a substrate 13a of a width W12 (<W11), which is 1.2 mm or so, and a plurality of cramp pieces 13b~13d projecting alternately on the opposite sides of the substrate 13a.

In this state, the terminal 13 is pressed with a pressing member 17, being guided by positioning walls 16, so that the cramp pieces 13b~13d may be stuck through the flat cable 3 in an area corresponding to the flat conductor 10a. As a result, the cramp pieces 13b~13d are stuck through the flat conductor 10a and thereby electrically connected with the flat conductor 10a.

Figure 3:
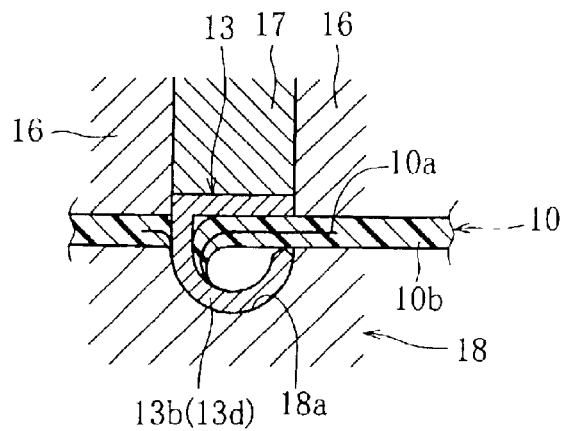
FIG. 3 is a cross-sectional view showing how a cramp piece of a terminal is cramped to a flat cable.

Next, as shown in FIG. 1, the punch die 15 is moved down as indicated by arrow A to be separated from the ends of the cramp pieces 13b~13d. Then, a cramp 18 that has been moved down too is moved left as indicated by arrow B so that a bending concave portion 18a may face the ends of the cramp pieces 13b~13d. When the cramp 18 is moved up in this state, the cramp pieces 13b~13d are bent inward with the bending concave portion 18a and cramped to the flat cable 10, as shown in FIG. 3.

When the cramp pieces 13b~13d are connected with the flat conductor 10a of the flat cable 10 by two steps consisting of sticking and cramping in the above-described way, the cramp pieces 13b~13d are surely stuck through the flat conductor 10a even if the terminal 13 is small in size. In addition, as shown in FIG. 3, the portions of the flat conductor 10a where the cramp pieces 13b~13d are stuck through the flat conductor 10a are drawn out and cut, so that they and formed into long edge portions 10c. The flat cable 10 is in sufficient contact with the cramp pieces 13b~13d, at those edge portions 10c. Further, the edge portions 10c and the cramp pieces 13b~13d are surely bent together, and their curves are stable. Thus, by the method according to the present invention, the flat conductor 10a and the cramp pieces 13b~13d can be electrically connected stably with little variation in contact resistance.

Figure 4:
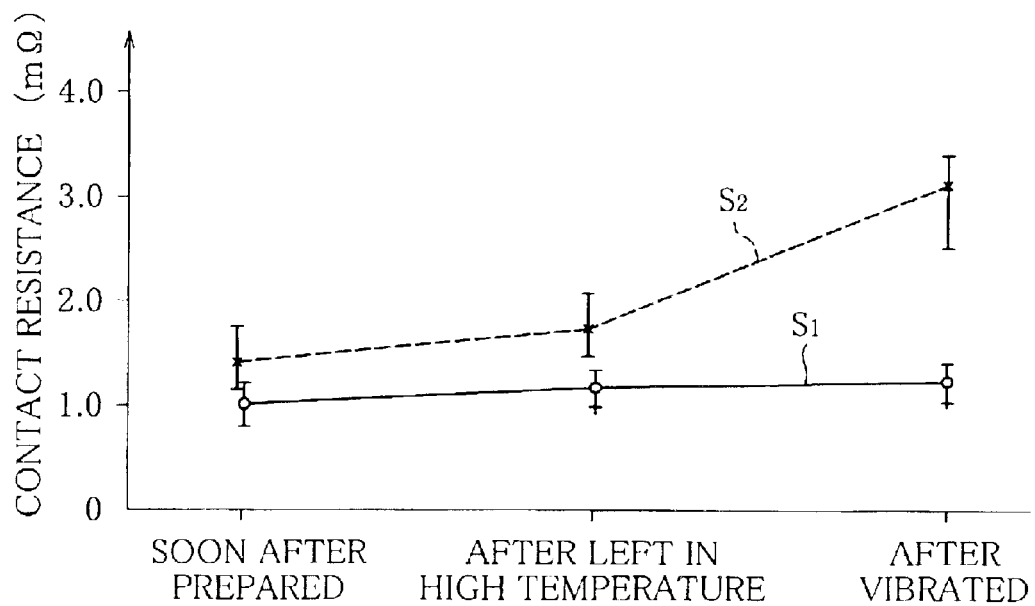
FIG. 4 is a graph showing the result of measurement of how contact resistance in a flat cable connected by the method according to the present invention and in a flat cable connected by a conventional method varies, when the flat cables are left in a high temperature and then subjected to a vibration test.

FIG. 4 is a graph showing the result of measurement of how contact resistance in samples S1, S2 varied. Here, sample S1 was prepared by connecting a terminal of 0.25 mm in substrate thickness and 1.2 mm in width to a flat cable of 0.33 mm in thickness and 6.4 mm in width comprising two flat conductors 10a of 0.15 mm in thickness and 1.5 mm in width insulated with a polyethylene terephthalate film, according to the method of the present invention. Sample 2 was prepared by connecting the same terminal to the same flat cable according to the conventional method. The terminal and the flat cable are thought to be used in an environment that varies. Therefore, contact resistance in each sample was measured three times, that is, soon after the sample was prepared, after the sample was left in high temperature for a predetermined time (100° C.×120 hours), and after the sample was subjected to a vibration test. In the vibration test, the sample was vibrated back and forth, left and right, and up and down with 4.5 G at 20~200 Hz with a sweep time of 3 minutes.

FIG. 4 shows that contact resistance varied less in sample S1 prepared by connecting the terminal and flat cable according to the method of the present invention than in sample S2 prepared by connecting them according to the conventional method. This means that more stable electrical connection producing less variation was formed in sample 1.

Next, a second embodiment of method of connecting a flat cable and a terminal according to the present invention will be described on the basis of FIGS. 5 to 8.

Figure 5:
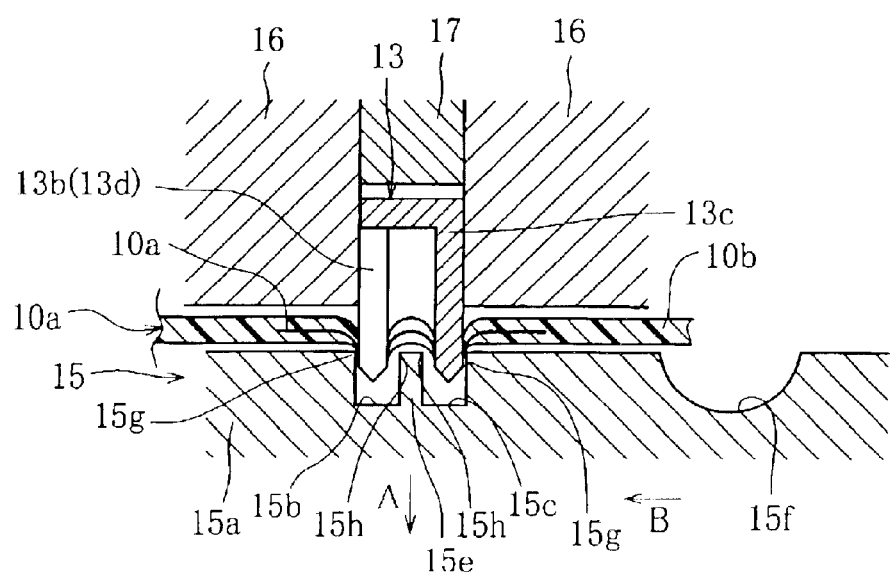
FIG. 5 is a cross-sectional view showing a second embodiment of method of connecting a flat cable and a terminal according to the present invention.
Figure 6:
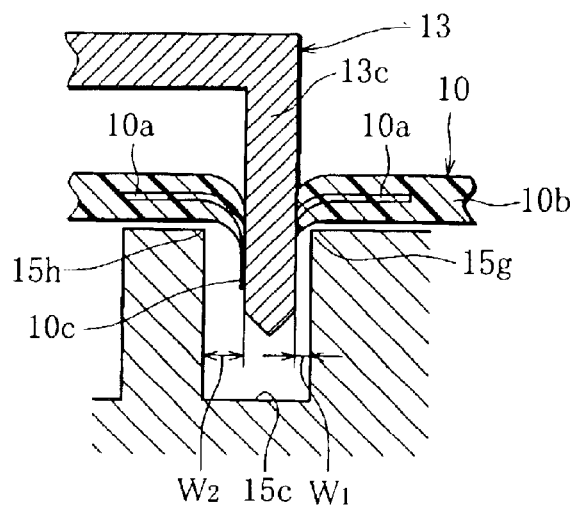
FIG. 6 shows part of FIG. 5 on an enlarged scale.

In the second embodiment, in a sticking step in which a terminal 13 is pressed with a pressing member 17 to be stuck into a flat cable 10, a punch die 15 having receiving cavities 15b, 15c on the opposite sides of a partition wall 15e of a small width is used, as shown in FIGS. 5 and 6. When the terminal 13 is to be stuck into the flat cable 10, the terminal 13 is positioned so that the cramp pieces 13b (13d), 13c may be received in their corresponding receiving cavities 15b, 15c, each with a larger space w2 on the inner side and a smaller space w1 on the outer side, as shown in FIGS. 5 and 6. Here, the inner side means the side closer to the partition wall 15e. After positioned as above, the terminal 13 is stuck into the flat cable 10.

The punch die 15 is then moved in direction A (downwards) so that the end portions of the cramp pieces 13b (13d), 13c struck through the flat cable 10 may come out of their corresponding receiving cavities 15b, 15c.

Then, the punch die 15 is moved in direction B to a position where a bending concave portion 15f faces the ends of the cramp pieces 13b (13d), 13c struck through the flat cable 10.

Figure 7:
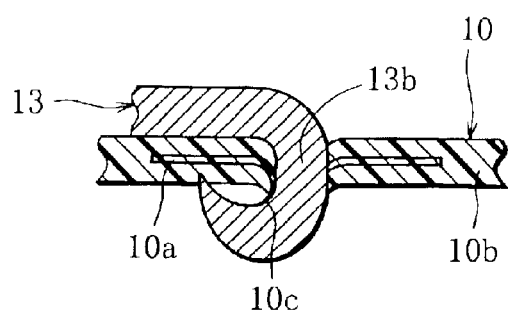
FIG. 7 is a cross-sectional view showing how a flat cable and a cramp piece are connected by a cramping step.

Then, the punch die 15 is moved up so that the end portions of the cramp pieces 13b (13d), 13c may come into the bending concave portion 15f, and then the terminal 13 is pressed with the pressing member 17. As a result, the cramp pieces 13b (13d), 13c of the terminal 13 are bent and cramped to the flat cable, as shown in FIG. 7.

As mentioned above, in the second embodiment, when the cramp pieces 13b (13d), 13c are stuck through the flat cable 10, the cramp pieces 13b (13d), 13c are received in their corresponding receiving cavities 15b, 15c, each with a larger space w2 on the inner side, i.e., the side closer to the partition wall 15e and a smaller space w1 on the outer side.

Therefore, on the outer side that corresponds to a smaller space w1, large shearing stress is produced in the flat cable 10 that is supported with the edge 15g of the punch die 15 (see FIGS. 5 and 6). As a result, on the edge 15g side, the insulation 10b and the flat conductor 10a of the flat cable 10 are drawn out less before they shear off.

On the inner side that corresponds to a larger space w2, a distance between the edge 15h of the punch die 15 and the cramp piece is large. Therefore, the flat cable 10 is drawn out longer on the inner side before it shears off. As the cramp piece 13b (13d), 13c moves downward, the flat cable 10 on the inner side is pressed inward by the cramp piece 13b (13d), 13c. Then, when the cramp piece 13b (13d), 13c is bent into a circular arc shape with the bending concave portion 15f and thereby cramped to the flat cable 10, the longer drawn-out edge portion 10c is rolled in the cramp piece 13b (13d), 13c, as shown in FIG. 7. This ensures a large area of electrical contact between the cramp piece 13b (13d), 13c and the flat conductor 10a, and therefore forms a stable electrical connection.

Here, a sticking experiment was conducted using a flat cable 10 of 0.32 mm in thickness comprising two flat conductors 10a of 2.0 mm in width insulated with an insulating film 10b of polyethylene terephthalate. When the terminal was positioned so that the center of each cramp piece 13b (13d), 13c might be off the center of its corresponding receiving cavity 15b, 15c by 1 mm or less, satisfactory connection was obtained.

It is desirable that the center of each cramp piece 13b (13d), 13c is off the center of its corresponding cavity and located on the outer side, i.e., on the edge 15g side of its corresponding cavity, as shown in FIG. 6, because in that case, a longer drawn-out edge portion 10c is rolled in the cramp piece 13b (13d), 13c, which ensures a large area of contact between the cramp piece 13b (13d), 13c and the conductor. However, the center of each cramp piece 13b (13d), 13c may be located on the inner side, i.e., on the edge 15h side of its corresponding receiving cavity. Also in that case, contact between the cramp piece 13b (13d), 13c and a conductor is ensured, because a cut and longer drawn-out flat conductor 10a adheres to the outer surface of the cramp piece 13b (13d), 13c that is bent into a circular-arc shape.

Figure 8:
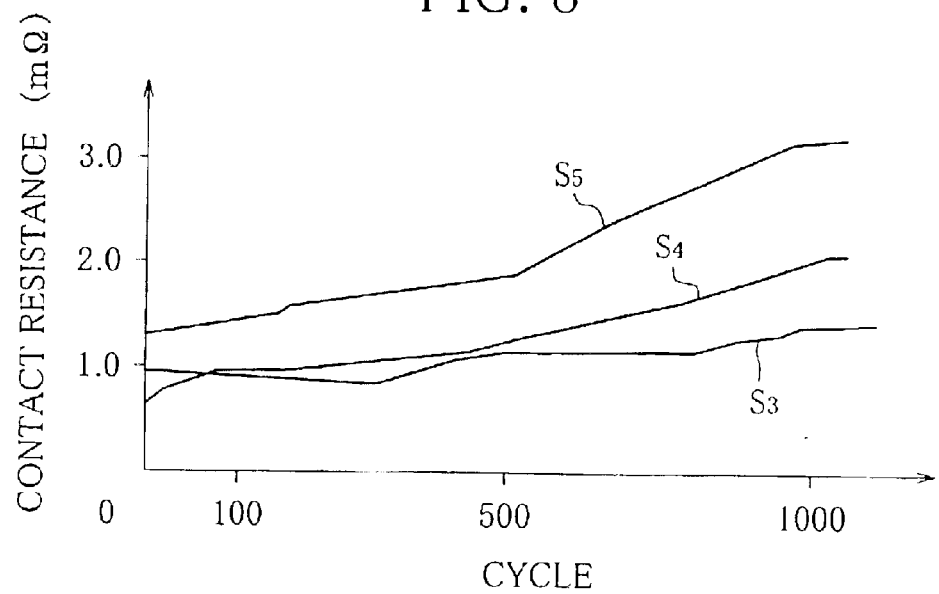
FIG. 8 is a graph showing the result of measurement of how contact resistance varies when thermal shock is given to samples, where samples are prepared by sticking cramp pieces through flat cables comprising flat conductors in different ways and bending the end portions of the cramp pieces that have been struck through the flat cables into a circular arc shape to thereby fix the cramp pieces to the flat cables.

FIG. 8 is a graph showing the result of measurement of how contact resistance in samples S3 to S5 varied, when 1000 cycles of thermal shock of +80° C.~−30° C. were given to samples S3 to S5. Here, samples S3 to S5 were prepared by sticking cramp pieces 13b (13d), 13c through above-described flat cables 10 of 0.32 mm in thickness comprising two flat conductors 10a of 2.0 mm in width, in different ways, and bending the end portions of the cramp pieces that had been stuck through the flat cables, into a circular arc shape.

More specifically, sample S3 was prepared by sticking cramp pieces 13b (13d), 13c through a flat cable 10 according to the connecting method of the present invention. Sample S4 was prepared by sticking cramp pieces 13b (13d), 13c through a flat cable 10 at the centers of their corresponding receiving cavities 15b, 15c. Sample S5 was prepared by sticking cramp pieces 13b (13d), 13c through a flat cable 10 placed over a bending concave portion 15f, without using receiving cavities 15b, 15c, and bending them into a circular arc shape.

FIG. 8 clearly shows that the connecting method of the present invention can provide stable connection with smaller contact resistance, even when a flat cable 10 comprises a thin and narrow flat conductor 10a.

Next, a third embodiment of method of connecting a flat cable and a terminal according to the present invention will be described on the basis of FIGS. 9 to 11.

The third embodiment of connecting method is applied to the case where terminals 13 should be connected to a plurality of flat conductors 10a of a flat cable 10, respectively, at the same time. In the third embodiment, a punch die 20 having as many sets of receiving cavities 20a, 20b as flat conductors 10a and as many bending concave portions 20c as flat conductors 10a as shown in FIG. 9 is used. Here, the pitch between the sets of receiving cavities 20a, 20b and the pitch between the bending concave portions 20c are the same as the pitch between the flat conductors 10a.

When terminals 13 are to be connected to a plurality of flat conductors 10a of a flat cable 10, respectively, the flat cable 10 is placed on the punch die 20 so that the flat conductors 10a may be located over their corresponding sets of receiving cavities 20a, 20b. Then, the terminals 13 are placed over the flat conductors 10, respectively, with their cramp pieces 13b (13d), 13c facing downwards. Then, the terminals 13 are pressed with pressing members 17, respectively, being guided by positioning walls 16, at the same time.

As a result, the cramp pieces 13b~13d of the terminals 13 are stuck through their corresponding flat conductors 10a of the flat cable 10 at the same time. Here, it is desirable that each terminal 13 is positioned so that its cramp pieces 13b (13d), 13c may be received in their corresponding cavities 20a, 20b, each with a larger space w2 on the inner side, i.e., the side closer to the opposite receiving cavity, and a smaller space w1 on the outer side, as described in connection with the third embodiment, and then stuck into the flat cable.

Figure 9:
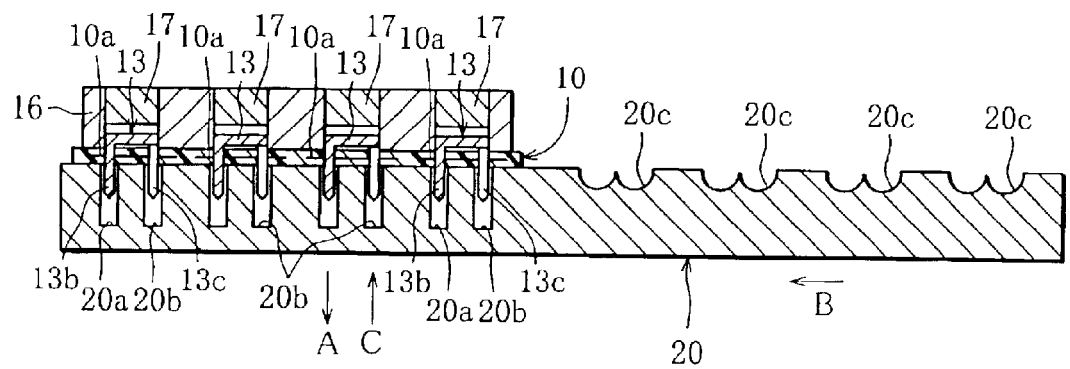
FIG. 9 is a cross-sectional view showing how sticking is performed in a third embodiment of method of connecting a flat cable and a terminal according to the present invention.

Then, the punch die 20 is moved downwards as indicated by arrow A in FIG. 9 so that the end portions of the cramp pieces 13b (13d), 13c of the terminals 13, which have been stuck through their corresponding flat conductors 10a of the flat cable 10, may come out of their corresponding receiving cavities 20a, 20b.

The punch die 20 is then moved left as indicated by arrow B to a position where the end portions of the cramp pieces 13b (13d), 13c of the terminals 13, which have been stuck through the flat cable 10, face their corresponding bending concave portions 20c.

Then, the punch die 20 is moved up as indicated by arrow C so that the end portions of the cramp pieces 13b (13d), 13c of the terminals 13 may come into their corresponding bending concave portions 20c. Then, the terminals 13 are pressed with the pressing members 17. As a result, the cramp pieces 13b (13d), 13c of the terminals 13 are bent inward and cramped to the flat cable 10 as shown in FIG. 10.

In the case where the cramp pieces 13b (13d), 13c of all the terminals 13 are stuck through their corresponding flat conductors 10a of the flat cable 10 at the same time this way, the cramp pieces 13b (13d), 13c of all the terminals 13 have been stuck through their corresponding flat conductors 10a, before the flat conductors 10a are drawn out due to the cramp pieces 13b (13d), 13c being stuck through them.

Figure 11:
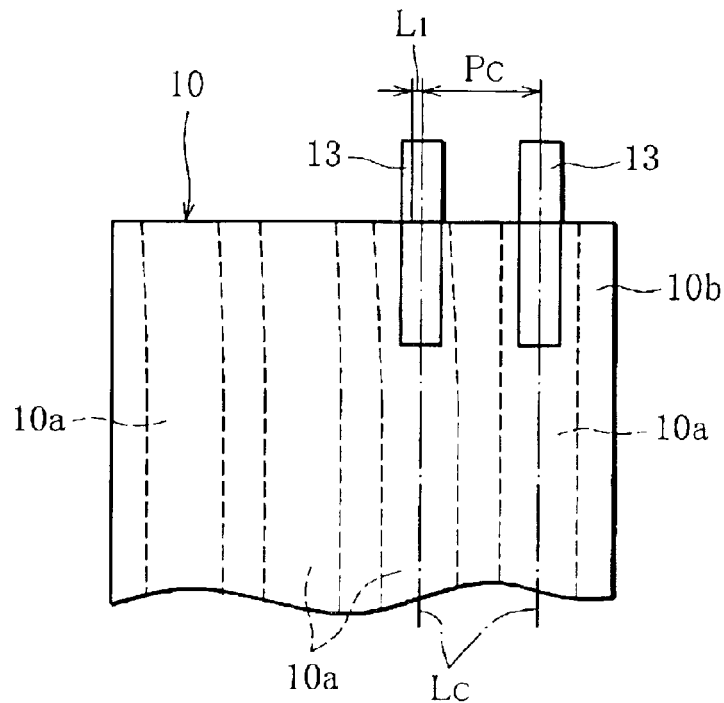
FIG. 11 is a plan view of a flat cable, for use in explaining what trouble may happen when terminals are stuck through a flat cable successively.
Figure 12:
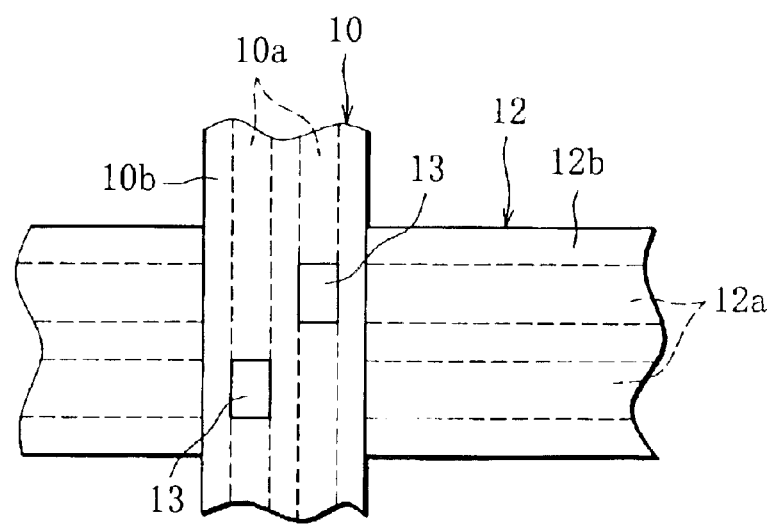
FIG. 12 is a plan view showing a fourth embodiment of method of connecting a flat cable and a terminal according to the present invention, where cramp pieces of terminals have been stuck through to-be-connected flat cables that are placed one on the other.

In contrast thereto, in the case where the cramp pieces 13b (13d), 13c of all the terminals 13 are stuck through their corresponding flat conductors 10a of the flat cable 10 successively, there arise difficulties as follows:

As shown in FIG. 11, when a terminal 13 is to be stuck into the first flat conductor 10a on the right, the center of the terminal 13 is placed on the center line Lc of the flat conductor 10a and the cramp pieces 13b (13d), 13c are stuck through the flat conductor 10a. At this time, in the flat cable 10, tensile stress is produced, which acts to relieve the sticking force with which the cramp pieces 13b (13d), 13c are stuck through the flat conductor 10a. As a result, the flat conductor 10a and the insulation 10b are drawn out in the width direction. The smaller in thickness the flat conductor 10a and the insulation 10b are, the more they are drawn out in the width direction. For example, it has been ascertained that in the case where the flat cable 10 comprises a flat conductor 10a of 0.15 mm in thickness and 1.5 mm in width and an insulation 10b of 0.09 mm in thickness, it is drawn out by 0.05~0.08 mm when a terminal 13 is stuck through it.

Then, when a terminal 13 is to be stuck into the second flat conductor 10a on the right, the center of the terminal 13 is placed to have a space corresponding to the pitch Pc between the flat conductors 10a (distance between the center lines Lc of the adjacent flat conductors 10a) as shown in FIG. 11, and in that position, the terminal 13 is stuck into the flat cable. At that time, however, due to having stuck the terminal 13 through the first flat conductor 10a on the right, the flat cable 10 has already been drawn out in the width direction. Therefore, when the terminal 13 is stuck into the second flat conductor 10a with a space corresponding to the pitch Pc, the terminal 13 comes to be off the center of the second flat conductor 10a by a distance L1 to the right as shown in FIG. 11.

Each time a terminal 13 is stuck into the next flat conductor 10a, the flat conductor 10a and the insulation 10b are drawn out in the width direction, and the center of the flat conductor 10a becomes further away from its original position to the left. Thus, when terminals 13 are stuck through flat conductors 10a successively, with a space corresponding to the pitch Pc between, the terminals 13 become gradually away from their intended positions on their corresponding flat conductors 10a, to the right. This makes the connection between the terminals 13 and their corresponding flat conductors 10a imperfect. When the flat cable comprises a large number of flat conductors 10a, a terminal 13a may be stuck though the insulation lob, not its corresponding flat conductor 10a, or in other words, a terminal may not be connected with its corresponding flat conductor 10a. In the third embodiment of the present invention, in order that the terminals 13 may not be out of position in being stuck into the flat conductors 10a, the terminals 13 are connected to their corresponding flat conductors 10a of the flat cable 10a at the same time.

When the terminals 13 are connected to their corresponding flat conductors 10a of the flat cable 10a at the same time, the cramp pieces 13b (13d), 13c of the terminals 13 can be surely stuck through their corresponding flat conductors 10a, in position. Further, in this method, since the terminals are stuck into the flat cable by a single action, the tact time, i.e., the time required to connect the terminals 13 to the flat cable is reduced.

Next, a fourth embodiment of method of connecting a flat cable and a terminal according to the present invention will be described on the basis of FIGS. 12 to 15.

In the fourth embodiment of connecting method, a flat cable 10 and a flat cable 12 which is similar in structure to the flat cable 10 and comprises a flat conductor 12a larger in width than a flat conductor 10a are placed one on the other so that at least connecting portions of to-be-connected flat conductors 10a, 12a may be placed one on the other. In the fourth embodiment, the flat cables 10, 12 are placed so that a flat conductor 10a smaller in width may be over a flat conductor 12a larger in width.

Figure 13:
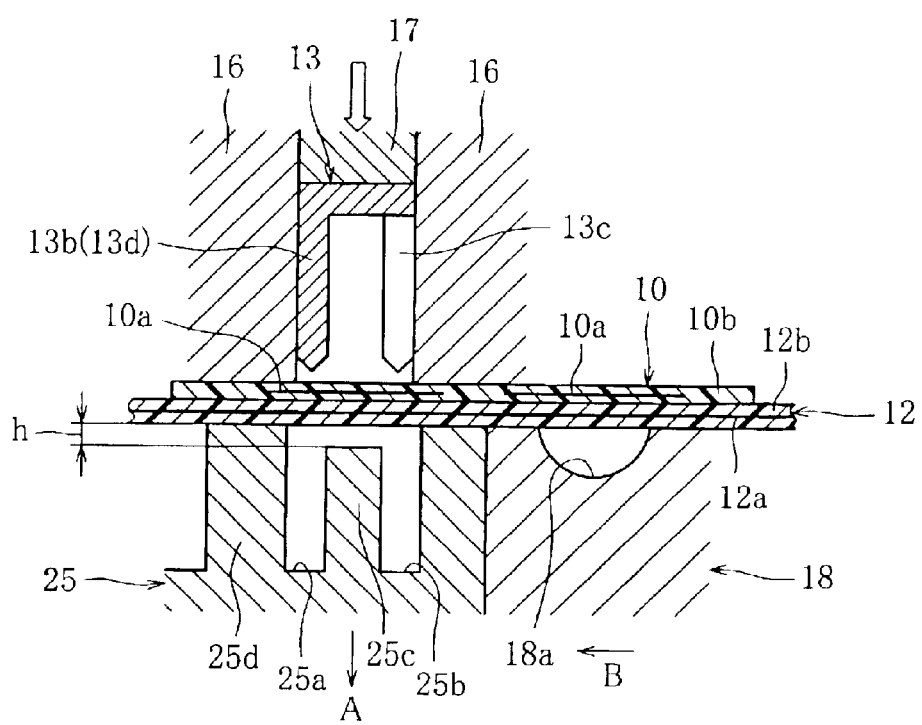
FIG. 13 is a cross-sectional view showing how flat cables, cramp pieces, a pressing member, a punch die and a cramp are placed in the fourth embodiment.
Figure 14A:
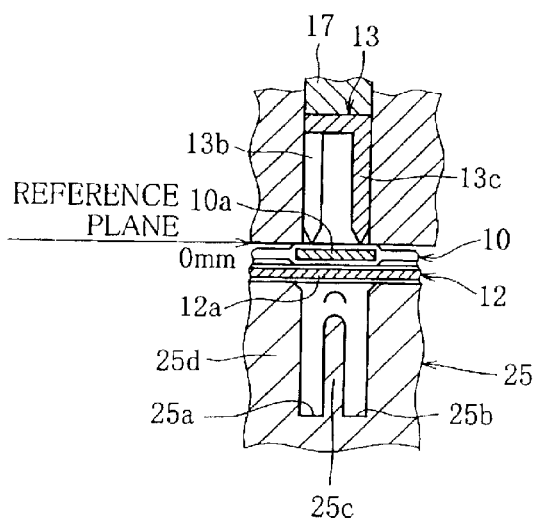
FIGS. 14A to 14E are cross-sectional views showing how cramp pieces are stuck through two flat cables using a punch die having a height difference h, where
Figure 14B:
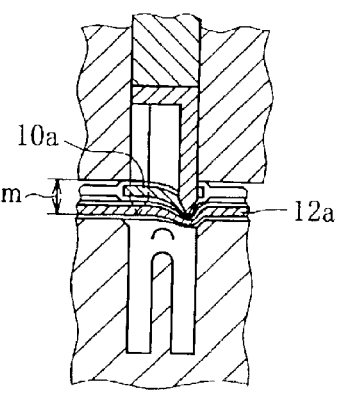
Figure 14C:
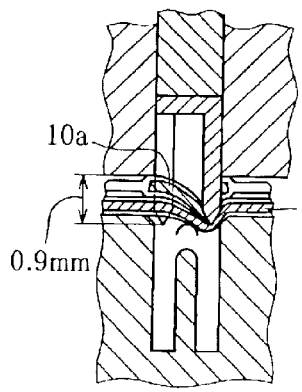
Figure 14D:
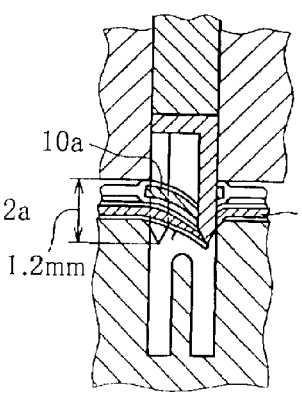
Figure 14E:
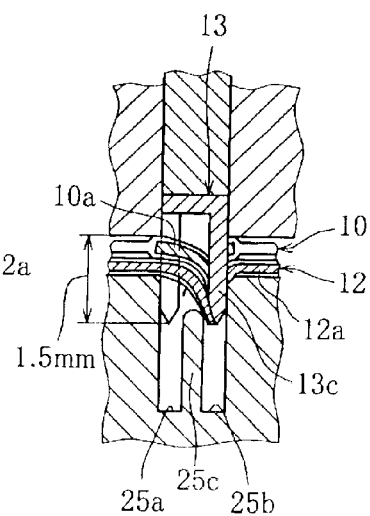

The flat conductors 10a, 12a of the flat cables 10, 12 placed one on the other this way are connected by the terminal 13 as follows:

First, the flat cables 10, 12 placed one on the other are placed on a punch die 25. As shown in FIG. 13, in the punch die 25, the upper surface of a partition wall 25c between receiving cavities 25a, 25b is at a lower height than the upper surfaces of outer walls 25d are. There is a height difference h between both.

In this state, a terminal 13 is pressed with a pressing member 17, being guided by positioning walls 16. As a result, the cramp pieces 13b~13d of the terminal are stuck through the flat cables 10, 12, from the flat conductor 10a that is smaller in width to the flat conductor 12a that is larger in width. Then, the end portions of the cramp pieces 13b~13d are bent and thereby cramped to the flat cables. Thus, the cramp pieces 13b~13d are stuck through the flat cables 10, 12 and electrically connected with the flat conductors 10a and 12a.

In the fourth embodiment, when the cramp pieces 13b~13d are stuck into the insulations 10b, 12b of the flat cables 10, 12, even if the lower flat cable 12 bends downwards the bending portion of the flat cable 12 is held in a space over the partition wall 25c that is smaller in height. Therefore, sticking force acting on the cramp pieces 13b~13d is restrained, and the partition wall 25c prevents the flat cable 12 from bending downwards excessively. Thus, the bending flat cable 12 does not come into the receiving cavities 25a, 25b, and the cramp pieces 13b~13d are stuck through the flat cable 12 without difficulties. As a result, in the fourth embodiment, the corresponding flat conductors 10a, 12a placed one on the other are stably electrically connected by the terminal 13.

Further, the flat cables 10, 12 are placed so that the flat conductor 10a smaller in width may be over the flat conductor 12a larger in width, and the cramp pieces 13b~13d are stuck through the flat conductors 10a, 12a, from the flat conductor 10a smaller in width to the flat conductor 12a larger in width. This means that the cramp pieces 13b~13d are stuck into the flat conductor 10a smaller in width, over the flat conductor 12a larger in width. Therefore, the terminal does not fail to be stuck through the lower flat conductor 12a larger in width. Thus, the cramp pieces 13b~13d are surely stuck through the flat conductors 10a, 12a placed one on the other and connects them together.

The punch die 25 is then moved down as indicated by arrow A in FIG. 13 to be separated from the ends of the cramp pieces 13b~13d. Then, a cramp 18 that has been moved down too is moved left as indicated by arrow B so that a bending concave portion 18a may face the ends of the cramp pieces 13b~13d. In this state, when the cramp 18 is moved upward, the cramp pieces 13b~13d are bent inward and cramped to the flat cables 10, 12.

FIGS. 14A~14E show how the cramp pieces 13b~13d are stuck through the flat cables 10, 12 using the punch die 25 having a height difference h between the taller outer walls 25c and the shorter partition wall 25c. As the cramp pieces 13b~13d are stuck through the flat cables 10, 12, the flat cables gradually bends, so that the surface of the flat cable 10 moves down gradually from its original position that is considered as a reference plane. FIGS. 14A~14E show the states where the surface of the flat cable 10 has moved down from the reference plane by 0.6 mm, 0.9 mm, 1.2 mm, and 1.5 mm, respectively.

How the cramp pieces 13b~13d were stuck through the flat cables 10, 12 was observed in each of the cases where the height difference h was 0.3 mm, 0.2 mm, and 0 mm, respectively. The observation was made in the following manner: When the ends of the cramp pieces 13b~13d were stuck into the flat cables 10, 12 by 0,6 mm, 0.9 mm, 1.2 mm or 1.5 mm, which was measured from the reference plane corresponding to the upper surface of the flat cable 10, the terminal and the flat cables were cramped with resin and cut. The flat cable 10 was one comprising a flat conductor 10a of 0.15 mm in thickness and 1.5 mm in width made of copper and an insulation 10b of 0.09 mm in thickness made of polyethylene terephthalate. The flat cable 12 was one comprising a flat conductor 12a of 0.15 mm in thickness and 2.5 mm in width made of copper and an insulation 12b of 0.09 mm in thickness made of polyethylene terephthalate. The terminal was made of brass. The flat cables 10, 12 were placed one on the other, and the cramp pieces 13b~13d (1.1 mm in base and 2.4 mm in height) of the terminal 13 were stuck into the flat cables 10, 12.

FIGS. 14A~14E clearly show that when the cramp pieces 13b~13d are stuck into the insulations 10b, 12b of the flat cables 10, 12, even if the lower flat cable 12 bends downwards, the bending portion of the lower flat cable 12 is held in a space over the partition wall 25a that is smaller in height, and that the partition wall 25c prevents the flat cable from bending downwards excessively.

From the above observation, it was found that when a punch die 25 having a height difference h between taller outer walls 25d and a shorter partition wall 25c was used, the cramp pieces 13b~13d were stuck into the flat cables 10, 12 without difficulties. However, when a punch die 25 where the height difference h was 0 mm was used, the cramp pieces 13b~13d could not be stuck into the flat cables 10, 12 and buckled.

Figure 15:
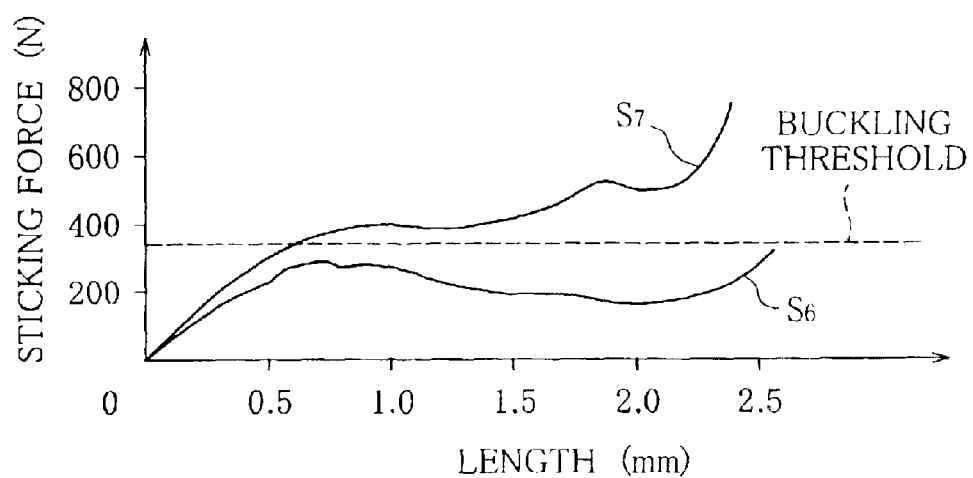
FIG. 15 is a graph showing relation between sticking force and the length by which the cramp pieces are stuck into the two flat cables as shown in FIG. 14.
Figure 16:
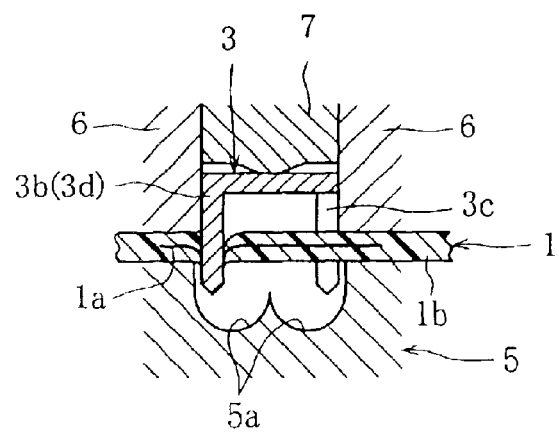
FIG. 16 is a cross-sectional view showing how a flat cable, cramp pieces, a pressing member, and a cramp are placed in a conventional method of connecting a flat cable and a terminal.
Figure 17:
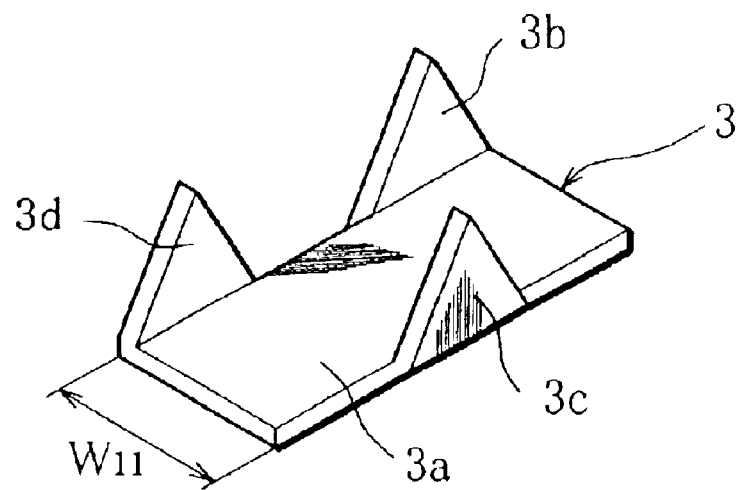
FIG. 17 is a perspective view of a terminal used in the conventional method of FIG. 16.
Figure 18:
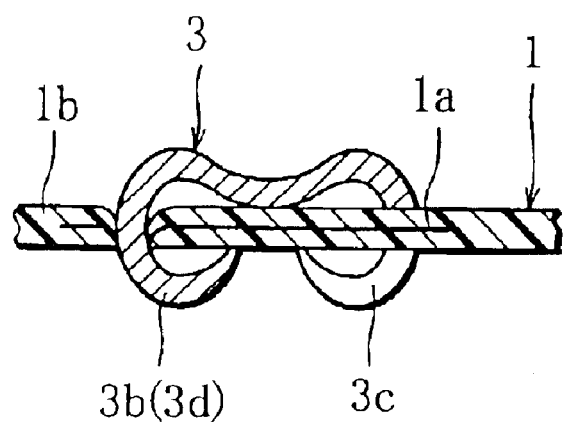
FIG. 18 is a cross-sectional view showing how cramp pieces of a terminal are stuck through and cramped to a flat cable according to the conventional connecting method.

In order to make this clearer, how sticking force (N) varied was measured in the case where a terminal 13 was stuck into flat cables 10, 12 using a punch die 25 having a height difference h of 0.2 mm (sample S6) and in the case where a terminal 13 was stuck into flat cables 10, 12 using a punch die 25 having no height difference (sample S7). FIG. 15 shows the result of the measurement. In FIG. 15, the length (mm) by which the ends of the cramp pieces 13b~13d were stuck into the flat cables 10, 12, which was measured from the reference plane, i.e., the upper surface of the flat cable 10, is represented along the horizontal axis, and sticking force (N) acting on the cramp pieces 13b~13d is represented along the vertical axis. FIG. 15 clearly shows that in sample S7 where the punch die 25 having no height difference h was used, sticking force acting on the cramp pieces 13b~13d was so large as to make the cramp pieces 13b~13d buckle.

It is to be noted that in the present invention, it is desirable that the number of projecting cramp pieces of a terminal is three or more, and that the cramp pieces project alternately on the opposite sides of a substrate of the terminal. When flat cables placed one on another are cramped together by three or more cramp pieces projecting alternately on the opposite sides of a substrate of a terminal, the flat conductors are connected together stably, and the cramp pieces are connected with the flat conductors stably.

In the above-described fourth embodiment, the flat conductors are the same in thickness and different in width, where the flat conductor smaller in width is intended for a smaller electric current and the flat conductor larger in width is intended for a larger electric current.

Figure 10:
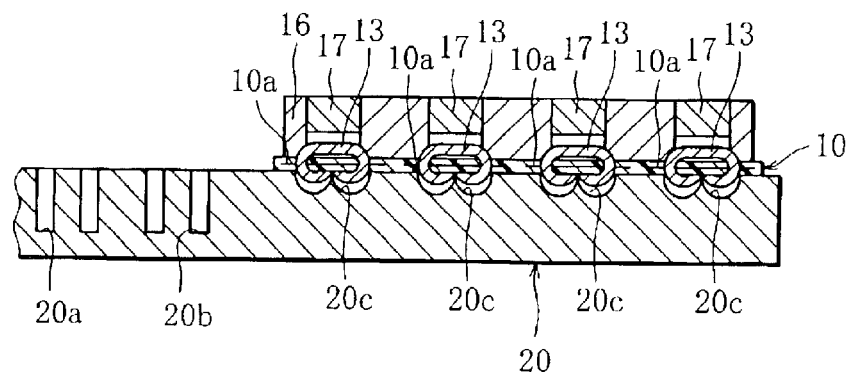
FIG. 10 is a cross-sectional view showing how cramping is performed in the embodiment of FIG. 9.

The fourth embodiment of connecting method where cramp pieces are stuck through a plurality of flat cables placed one on another can be applied to the second embodiment shown in FIGS. 5~8 as well as the third embodiment shown in FIGS. 9 and 10.

INDUSTRIAL APPLICABILITY

According to a first aspect of the present invention which relates to a method of connecting a flat cable and a terminal, cramp pieces are surely stuck through a flat conductor even if the cramp pieces are those of a terminal small in size and the flat conductor is small in width. In addition, long edge portions of the flat conductor that has been drawn out and cut by sticking the cramp pieces through the flat conductor are brought into sufficient contact with the cramp pieces, and surely bent into a stable shape. Thus, the flat cable and the terminal are electrically connected easily, with little variation in contact resistance.

According to a second aspect of the present invention, shearing stress produced in a flat conductor of a flat cable is larger on a side corresponding to a smaller space than on a side corresponding to a larger space. Therefore, on the smaller-space side, the flat conductor is drawn out less before it shears off. On the larger-space side, the flat conductor is drawn out longer before a cramp piece is stuck through the flat conductor. Thus, a longer drawn-out edge portion of the flat conductor is formed. Then, when the cramp piece is bent into a circular arc shape and thereby cramped to the flat cable, the longer drawn-out edge portion of the flat conductor is rolled in the cramp piece. This ensures a large area of electrical contact between the cramp piece and the flat conductor, and therefore, forms a stable electrical connection.

According to a third aspect of the present invention, cramp pieces of all terminals are struck through their corresponding flat conductors before the flat conductors are drawn out due to the cramp pieces being stuck through them. This ensures that the cramp pieces are stuck through their corresponding flat conductors in position. In addition, in this method, since a plurality of terminals are stuck into a plurality of corresponding flat conductors by a single action, the tact time, i.e., the time required to connect the terminals to the flat cable is reduced.

According to fourth and fifth aspects of the present invention, when cramp pieces, which should be stuck through insulations and flat conductors of flat cables placed one on another, are stuck into upper flat cables, even if lower flat cables bend downwards, the bending portions of the lower flat cables are held in a space over a partition wall that is smaller in height. Thus, the bending portions of the lower flat cables do not come into receiving cavities, and therefore, the cramp pieces are stuck through the lower flat cables without difficulties. As a result, the upper and lower flat conductors are connected together by the cramp pieces, stably.

According to a sixth aspect of the present invention, cramp pieces are surely stuck through flat conductors placed one on another to thereby connect the flat conductors together.

According to a seventh aspect of the present invention, shearing stress produced in flat conductors placed one on another is larger on a side corresponding to a smaller space than on a side corresponding to a larger space. Therefore, on the smaller-space side, the flat conductors are drawn out less before they shear off. On the larger-space side, the flat conductors are drawn out longer before a cramp piece is stuck through the flat conductors. Then, when the cramp piece is bent into a circular arc shape and thereby cramped to the flat cables, longer drawn-out edge portions of the flat conductors are rolled in the cramp piece. This ensures a large area of electrical contact between the cramp piece and the flat conductors, and therefore, forms a stable electrical connection.

According to an eighth aspect of the present invention, cramp pieces of all terminals are struck through their corresponding flat conductors placed one on another, before the flat conductors are drawn out due to the cramp pieces being stuck through them. This ensures that the cramp pieces are stuck through their corresponding flat conductors in position. In addition, in this method, since a plurality of terminals are stuck into a plurality of corresponding flat conductors placed one on another by a single action, the tact time, i.e., the time required to connect the terminals to the flat cables is reduced.

What is claimed is:

1. A method of connecting a flat cable and a terminal in which a flexible flat cable comprising a flat conductor insulated with an insulation and a terminal having a plurality of cramp pieces are connected by sticking said cramp pieces through said flat cable in an area corresponding to an intended portion of said flat conductor to thereby connect said cramp pieces with said flat conductor, and bending said cramp pieces that have been stuck through said flat cable to thereby fix said cramp pieces to said flat cable, said method comprising a sticking step in which said cramp pieces are stuck through said flat cable to be received in corresponding receiving cavities that are provided to allow said cramp pieces to maintain their shapes, wherein in said sticking step, each of said cramp pieces is stuck through said flat cable in a position that allows the cramp piece to be received in a corresponding receiving cavity with a larger space on an inner side and a smaller space on an outer side, where the inner side is a side that is closer to an opposite receiving cavity; and a cramping step in which said cramp pieces that have been stuck through said flat cable are bent with a bending concave portion and thereby cramped to said flat cable, wherein when said each cramp piece is stuck through said flat cable, said flat conductor is drawn out longer on the larger space side before said flat conductor shears off, and a longer drawn-out and sheared off portion of said flat conductor is brought in contact with the cramp piece, and wherein in the cramping step, each of said cramp pieces is bent in such a manner that part of the longer drawn-out and sheared off portion, which is in contact with the cramp piece, of said flat conductor, is rolled in the cramp piece.

2. The method of connecting a flat cable and a terminal according to claim 1, wherein said flat cable comprises a plurality of said flat conductors arranged in rows, and cramp pieces of a plurality of terminals are stuck through corresponding flat conductors of said flat cable at the same time.

3. The method of connecting a flat cable and a terminal according to claim 1 wherein a plurality of said flat cables are placed one on another, and said cramp pieces are stuck through said flat cables.

4. The method of connecting a flat cable and a terminal according to claim 3, further including a wall between said receiving cavities has an upper surface that is at a lower height than upper surfaces of outer walls of said receiving cavities.

5. The method of connecting a flat cable and a terminal according to claim 3 wherein said plurality of flat cables include flat conductors different in width, and said flat cable is arranged such that said cramp pieces are stuck through said plurality of flat cables, from a one of said flat conductors smaller in width to one of said flat conductors larger in width.

6. The method of connecting a flat cable and a terminal according to claim 3 wherein each of said plurality of flat cables comprises a plurality of flat conductors arranged in rows, and cramp pieces of a plurality of terminals are stuck through corresponding flat conductors of said plurality of flat cables at the same time.

* * * * *

UNITED STATES PATENT AND TRADEMARK OFFICE
CERTIFICATE OF CORRECTION

PATENT NO. : 6,842,976 B2
DATED : January 18, 2005
INVENTOR(S) : Enomoto et al.

It is certified that error appears in the above-identified patent and that said Letters Patent is hereby corrected as shown below:

Column 14,
Line 32, after "from" delete "a".

Signed and Sealed this

Twentieth Day of December, 2005

JON W. DUDAS
*Director of the United States Patent and Trademark Office*